(12) United States Patent
Hathaway

(10) Patent No.: US 6,778,999 B2
(45) Date of Patent: Aug. 17, 2004

(54) METHOD FOR DISTRIBUTING A SET OF OBJECTS IN COMPUTER APPLICATION

(75) Inventor: David J. Hathaway, Underhill Center, VT (US)

(73) Assignee: International Business Machines Corporation, Armonk, NY (US)

( * ) Notice: Subject to any disclaimer, the term of this patent is extended or adjusted under 35 U.S.C. 154(b) by 327 days.

(21) Appl. No.: 09/976,698

(22) Filed: Oct. 12, 2001

(65) Prior Publication Data

US 2003/0093396 A1 May 15, 2003

(51) Int. Cl.⁷ .............................................. G06F 17/30
(52) U.S. Cl. .................. 707/104.1; 707/10; 707/103 R; 709/251; 709/227; 711/114; 711/165; 257/208; 365/205; 716/7; 716/8; 716/10
(58) Field of Search ........................ 707/203, 10, 201, 707/102–104.1, 103 R; 716/6, 2, 7, 8, 10; 712/4; 711/114, 165; 709/251, 227, 225; 257/208; 438/129; 365/203–205

(56) References Cited

U.S. PATENT DOCUMENTS

| | | | | |
|---|---|---|---|---|
| 5,432,909 A | * | 7/1995 | Cok | 709/251 |
| 5,606,693 A | * | 2/1997 | Nilsen et al. | 707/10 |
| 5,634,125 A | * | 5/1997 | Li | 707/203 |
| 5,687,369 A | * | 11/1997 | Li | 707/203 |
| 5,717,229 A | * | 2/1998 | Zhu | 257/208 |
| 5,758,355 A | * | 5/1998 | Buchanan | 707/201 |
| 5,819,083 A | * | 10/1998 | Chen et al. | 707/10 |
| 5,849,610 A | * | 12/1998 | Zhu | 438/129 |
| 5,866,924 A | * | 2/1999 | Zhu | 257/208 |
| 6,219,753 B1 | * | 4/2001 | Richardson | 711/114 |
| 6,304,942 B1 | * | 10/2001 | DeKoning | 711/114 |
| 6,397,251 B1 | * | 5/2002 | Graf | 709/225 |
| 6,401,121 B1 | * | 6/2002 | Yoshida et al. | 709/227 |
| 6,530,004 B1 | * | 3/2003 | King et al. | 711/165 |
| 6,536,024 B1 | * | 3/2003 | Hathaway | 716/6 |
| 2003/0056082 A1 | * | 3/2003 | Maxfield | 712/4 |

FOREIGN PATENT DOCUMENTS

EP 0642092 A2 * 3/1995 .......... G06F/17/30

OTHER PUBLICATIONS

H. Eisenmann, F. M. Johannes; "*Generic Global Placement and Floorplanning*" Institute of Electronic Design Automation, Technical University, Munich, Germany 1998, pp. 269–274.

J. Vygen, "*Algorithms for Detailed Placement of Standard Cells*", Research Institute for Discrete Mathematics, University of Bonn, Germany, undated, 4 pages.

* cited by examiner

*Primary Examiner*—Frantz Coby
(74) *Attorney, Agent, or Firm*—DeLio & Peterson LLC; Peter W. Peterson

(57) ABSTRACT

A method of determining redistribution of objects among three or more containers in a network comprises determining an initial set of objects in each of the containers, identifying neighboring pairs of containers, determining a cost of moving objects between each of the neighboring pairs of containers, determining a desired change in occupancy of each container, and subsequently determining a desired total size of a set of objects to be moved between each identified neighboring pair of containers by solving a set of simultaneous linear equations. The objects are redistributed among the neighboring pairs of containers in accordance with the solution. The objects may be clock sinks and the containers clock nets on a chip, or the objects may be circuits to be placed in an integrated circuit and the containers regions of the chip, or the objects may be data files and the containers individual network server computers.

32 Claims, 5 Drawing Sheets

| A | B | C | D | E |
|---|---|---|---|---|
| OCC = 90 | OCC = 50 | OCC = 50 | OCC = 50 | OCC = 10 |
| CAP = 50 | CAP = 50 | CAP = 50 | CAP = 50 | CAP = 50 |
| JSRC = 40 | JSRC = 0 | JSRC = 0 | JSRC = 0 | JSRC = -40 |

OCC = Occupancy (number of objects in bin)
CAP = Capacity = $(\Sigma \, occ)/N$
JSRC = Incoming "Current" = OCC − CAP

| A | B | C | D | E |
|---|---|---|---|---|
| OCC = 90<br>CAP = 50<br>JSRC = 40 | OCC = 50<br>CAP = 50<br>JSRC = 0 | OCC = 50<br>CAP = 50<br>JSRC = 0 | OCC = 50<br>CAP = 50<br>JSRC = 0 | OCC = 10<br>CAP = 50<br>JSRC = −40 |

OCC = Occupancy (number of objects in bin)
CAP = Capacity = $(\Sigma occ)/N$

JSRC = Incoming "Current" = OCC − CAP

FIG. 1

A: $\quad 0 = (VA - VB)/R1 + 40$

B: $\quad 0 = (VB - VA)/R1 + (VB - VC)/R2 + 0$

C: $\quad 0 = (VC - VB)/R2 + (VC - VD)/R3 + 0$

D: $\quad 0 = (VD - VC)/R3 + (VD - VE)/R4 + 0$

E: $\quad 0 = (VE - VD)/R4 - 40$

FIG. 3

A: $\quad -40 = +VA - VB$

B: $\quad 0 = -VA + 2VB - VC$

C: $\quad 0 = \quad - VB + 2VC - VD$

D: $\quad 0 = \quad\quad - VC + 2VD - VE$

E: $\quad 40 = \quad\quad\quad - VD + VE$

FIG. 4

$VA = 0 \quad\quad JR1 = (40 - 0)/1 + 40$ $VB = 40 \quad\quad JR2 = (80 - 40)/1 + 40$ $VC = 80 \quad\quad JR3 = (120 - 80)/1 + 40$ $VD = 120 \quad\quad JR4 = (160 - 120)/1 + 40$ $VE = 160$

FIG. 5

METHOD FOR DISTRIBUTING A SET OF OBJECTS IN COMPUTER APPLICATION

BACKGROUND OF THE INVENTION

1. Field of the Invention

The present invention relates to a method for distributing a set of objects among a set of containers, for example, in an integrated circuit, and in particular relates to a method for improving the distribution of a set of circuits on a chip, balancing the load and/or fanout of a set of equivalent clock drivers in a clock tree, or placing data files on servers in a computer network.

2. Description of Related Art

Many integrated circuit design and other applications may be analogized as a set of objects, each of which is assigned to or placed in one of a set of containers. For example, in a clock optimization application on an integrated circuit, the containers may represent clock nets, with the objects representing clock sinks at specific locations on a chip. In a chip placement application, the containers may represent regions of a chip and the objects may represent circuits to be placed on the chip. In a network computing application, the containers may represent network server computers and the objects might represent large data files or databases residing on those servers.

In such an analog, one may assume that the application has the following characteristics:

Each object starts out assigned to an initial container, according to some set of criteria. In the clock optimization application an initial location-based sink clustering may define an initial set of clock nets. In the chip placement application an initial force-directed placement might be used to establish an initial placement. In the network workload optimization application, the initial assignment might place each file on the server closest to the file's point of creation.

The containers have some spatial relationship with each other, i.e., each container X has a set of closest neighbor containers, each at some distance from X. In the clock optimization application the distance might be the rectilinear distance between the centroids (mean sink X and Y coordinates) of neighboring nets. In the chip placement application the distance might be the rectilinear distance between the centers of adjacent regions. In the network workload optimization application the distance might be inversely related to the channel capacity between adjacent servers.

Each container has some capacity and each object has a size, and the initial assignment of objects to containers may cause some containers to exceed their capacity, i.e., contain too many objects, and others may be underfilled, i.e., have too few objects. Alternatively, an objective of the object distribution may be to equalize the occupancy of all containers; this can be seen as equivalent to the capacity model by considering the capacity of each container to be the average occupancy of all containers. In the clock optimization application the objective might be to equalize the load (occupancy) of each clock net, and the size of each clock sink might be related to its input load. In the chip placement application the container capacity might be the amount of uncommitted area in the region represented by the container, and the size of the circuits to be placed might be the areas they occupy. In a network workload optimization application the server capacity might be the available processing power of the server and the file size might be related to the frequency of queries related to it and the computation required to respond to those queries. Alternatively, the server capacity might be related to the disk space available to store the files and the file size might be related to the disk space required to store the file.

There is some cost associated with moving an object from its initial container which increases rapidly with the distance that the object is moved. In the clock optimization application this might be because of the additional wire required to connect widely separated sinks. In the chip placement application, this might be because of the additional wire required to connect nets to a circuit which is moved from its "ideal" location. In the network optimization application this might be the network bandwidth required to move the files.

A common approach to improving the distribution of objects between containers is to consider a pair or other small set of neighboring containers and to redistribute the objects between those containers so as to equalize the occupancy of each relative to its capacity. This is done repeatedly on all pairs or sets of neighboring clusters until convergence is achieved or some iteration limit is reached. This may require many iterations over all pairs of neighbors. One may consider the following list of numbers, representing the occupancy of a serially connected set of containers, and assume that the objective is to equalize the occupancy of all containers:

| 90 | 50 | 50 | 50 | 10 |
|----|----|----|----|----|

The iterative method described above might proceed as follows. Each of the following lines represents the state after the underlined pair of containers has been balanced. In each step it is assumed that the iterative algorithm always attacks the pair of neighbors with the largest occupancy difference, which are shown underlined:

EXAMPLE I

| | | | | | |
|---|---|---|---|---|---|
| 1. | _70_ | _70_ | 50 | 50 | 10 |
| 2. | 70 | 70 | 50 | _30_ | _30_ |
| 3. | 70 | _60_ | _60_ | 30 | 30 |
| 4. | 70 | 60 | _45_ | _45_ | 30 |
| 5. | 70 | _53_ | _52_ | 45 | 30 |
| 6. | _62_ | _61_ | 52 | 45 | 30 |
| 7. | 62 | 61 | 52 | _38_ | _37_ |
| 8. | 62 | 61 | _45_ | _45_ | 37 |
| 9. | 62 | 53 | 53 | 45 | 37 |
| 10. | _58_ | _57_ | 53 | 45 | 37 |
| 11. | 58 | 57 | _49_ | _49_ | 37 |
| 12. | 58 | 57 | 49 | _43_ | _43_ |
| 13. | 58 | _53_ | _53_ | 43 | 43 |
| 14. | 58 | 53 | _48_ | _48_ | 43 |
| 15. | _56_ | _55_ | 48 | 48 | 43 |
| 16. | 56 | _52_ | _51_ | 48 | 43 |
| 17. | 56 | 52 | 51 | _46_ | _45_ |
| 18. | 56 | 52 | _49_ | _48_ | 45 |
| 19. | _54_ | _54_ | 49 | 48 | 45 |
| 20. | 54 | _52_ | _51_ | 48 | 45 |
| 21. | 54 | 52 | 51 | _47_ | _46_ |
| 22. | 54 | 52 | _49_ | _49_ | 46 |
| 23. | 54 | _51_ | _50_ | 49 | 46 |
| 24. | _52_ | _52_ | 50 | 49 | 46 |
| 25. | 53 | 52 | 50 | _48_ | _47_ |
| 26. | 53 | 52 | _49_ | _49_ | 47 |
| 27. | 53 | _51_ | _50_ | 49 | 47 |
| 28. | _52_ | _52_ | 50 | 49 | 47 |
| 29. | 52 | 52 | 50 | _48_ | _48_ |
| 30. | 52 | _51_ | _51_ | 48 | 48 |
| 31. | 52 | 51 | _50_ | _49_ | 48 |

Two observations can be made from this example. First, it takes a long time to converge. Second, it doesn't actually converge to a completely balanced solution. The latter occurs because the granularity of objects prevents any local redistribution (since the final occupancy difference between all pairs of adjacent containers is one), even though a better global balance could be achieved by setting the occupancy of each container at 50.

Bearing in mind the problems and deficiencies of the prior art, it is therefore an object of the present invention to provide an improved method for distributing a set of objects on an integrated circuit.

It is another object of the present invention to provide a method for distributing a set of objects on an integrated circuit which converges more quickly than prior art methods.

A further object of the invention is to provide a method for distributing a set of objects on an integrated circuit which achieves better balance than prior art methods.

It is yet another object of the present invention to provide a method for distributing a set of objects on an integrated circuit which may be used for placement of a set of circuits on a chip, balancing the load and/or fanout of a set of equivalent clock drivers in a clock tree, or distributing large data files, e.g., databases, on network server computers.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of determining redistribution of objects among three or more containers in a network comprising determining an initial set of objects in each of the containers and identifying neighboring pairs of containers. The method then includes determining a cost of moving objects between each of the neighboring pairs of containers, determining a desired change in occupancy of each container, and subsequently determining a desired total size of a set of objects to be moved between each identified neighboring pair of containers by solving a set of simultaneous linear equations. The method may further include redistributing the objects among the neighboring pairs of containers in accordance with the solution of the set of simultaneous linear equations.

Preferably, the redistribution of objects among the neighboring pairs of containers comprises identifying neighboring pairs of containers in which the total size of objects to be moved does not exceed the total size of objects in the source container of the pair, moving objects between one of the identified pair of containers, and then repeating these steps until all neighboring pairs of containers have been identified. More preferably, the determination of redistribution of objects between each neighboring pair of containers includes rounding the total size of objects to be moved between neighboring pairs of containers determined by the solution of the set of simultaneous linear equations to the nearest whole number. After objects are moved between each container and a container in a neighboring pair, any error between the rounded whole number and the actual size of objects to be moved between neighboring pairs of containers determined by the solution of the set of simultaneous linear equations may be divided by the number of remaining neighbors of each container, and the quotient may be added to the total size of objects to be moved for each remaining neighbor. After objects are moved between each container and a container in a neighboring pair, a new set of simultaneous linear equations may be created and solved to determine the total size of objects to be moved between remaining neighboring pairs of containers.

The objects may be clock sinks and the containers clock nets on an integrated circuit chip, or the objects may be circuits to be placed in an integrated circuit and the containers regions of an integrated circuit chip, or the objects may be data files and the containers individual network server computers.

In another aspect, the present invention is directed to a method of determining redistribution of objects among three or more containers in a network comprising determining an initial set of objects in each of the containers, identifying neighboring pairs of containers, and determining a cost of moving objects between each of the neighboring pairs of containers. Thereafter, the method includes determining desired occupancy of each container after redistribution, and then subtracting the size of objects in each of the containers from the desired occupancy of each container after redistribution to determine the change in total size in each container. A theoretical electrical network model is then created by designating a plurality of nodes, each node representing a container, and designating a resistor between pair of nodes representing neighboring pairs of containers. Each resistor represents the cost of moving objects between the neighboring pairs of containers. The creation of the theoretical electrical network model further includes designating a current source connected to each node, with the current source representing the change in total size of objects in each container. The method then includes solving the theoretical electrical network model to determine theoretical current flow in each resistor, wherein the current flow in each resistor represents the total size of objects to be moved between neighboring pairs of containers. The method then includes determining redistribution of objects between each neighboring pair of containers in accordance with the theoretical current flow solved in the theoretical electrical network model. The method may further include redistributing the objects among the neighboring pairs of containers in accordance with the theoretical current flow solved in the theoretical electrical network model. Preferably, the theoretical electrical network model is solved by creating equations of current flow for each node, reducing the current flow equations for each node to simultaneous linear equations, and solving the simultaneous linear equations for theoretical current flow in each resistor.

The step of redistributing the objects among the neighboring pairs of containers may comprise initially, for each container, determining the total size of objects remaining in the container after all objects determined to be moved in accordance with the theoretical current flow solved in the theoretical electrical network model are moved to containers paired therewith. The step of redistributing the objects then includes identifying the container in the previous step having the largest total size of objects remaining in the container after all objects determined to be moved are moved to containers paired therewith. The objects from the container identified are then moved to a neighboring container to which the largest size of objects are to be moved from the container in accordance with the theoretical current flow solved in the theoretical electrical network model. Finally, these steps are repeated until all neighboring pairs of containers have been identified. Prior to the first step, there may be identified neighboring pairs of containers in which the total size of objects to be moved does not exceed the total size of objects in the source container of the pair.

Determining redistribution of objects between each neighboring pair of containers may include rounding the total size of objects to be moved between neighboring pairs of containers determined by the theoretical current flow to the nearest whole number. After objects are moved between each container and a container in a neighboring pair, any error between the rounded whole number and the actual size of objects to be moved between neighboring pairs of containers determined by the theoretical current flow may be divided by the total size of remaining neighbors of each container, and the quotient may be added to the total size of objects to be moved for each remaining neighbor. After objects are moved between each container and a container in a neighboring pair, a new theoretical electrical network model may be created and solved to determine the total size of objects to be moved between remaining neighboring pairs of containers.

The objects may be clock sinks and the containers clock nets on an integrated circuit chip, or the objects may be circuits to be placed in an integrated circuit and the containers regions of an integrated circuit chip, or the objects may be data files and the containers individual network server computers.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1 is a block representation of objects initially distributed in an interconnected series of containers.

FIG. 3 shows a current equation for each node in the electrical network diagram of FIG. 2.

FIG. 4 shows simultaneous linear equations based upon the current equations of FIG. 3.

FIG. 5 shows the solutions to the equations of FIG. 4.

DESCRIPTION OF THE PREFERRED EMBODIMENT(S)

Figure 2:
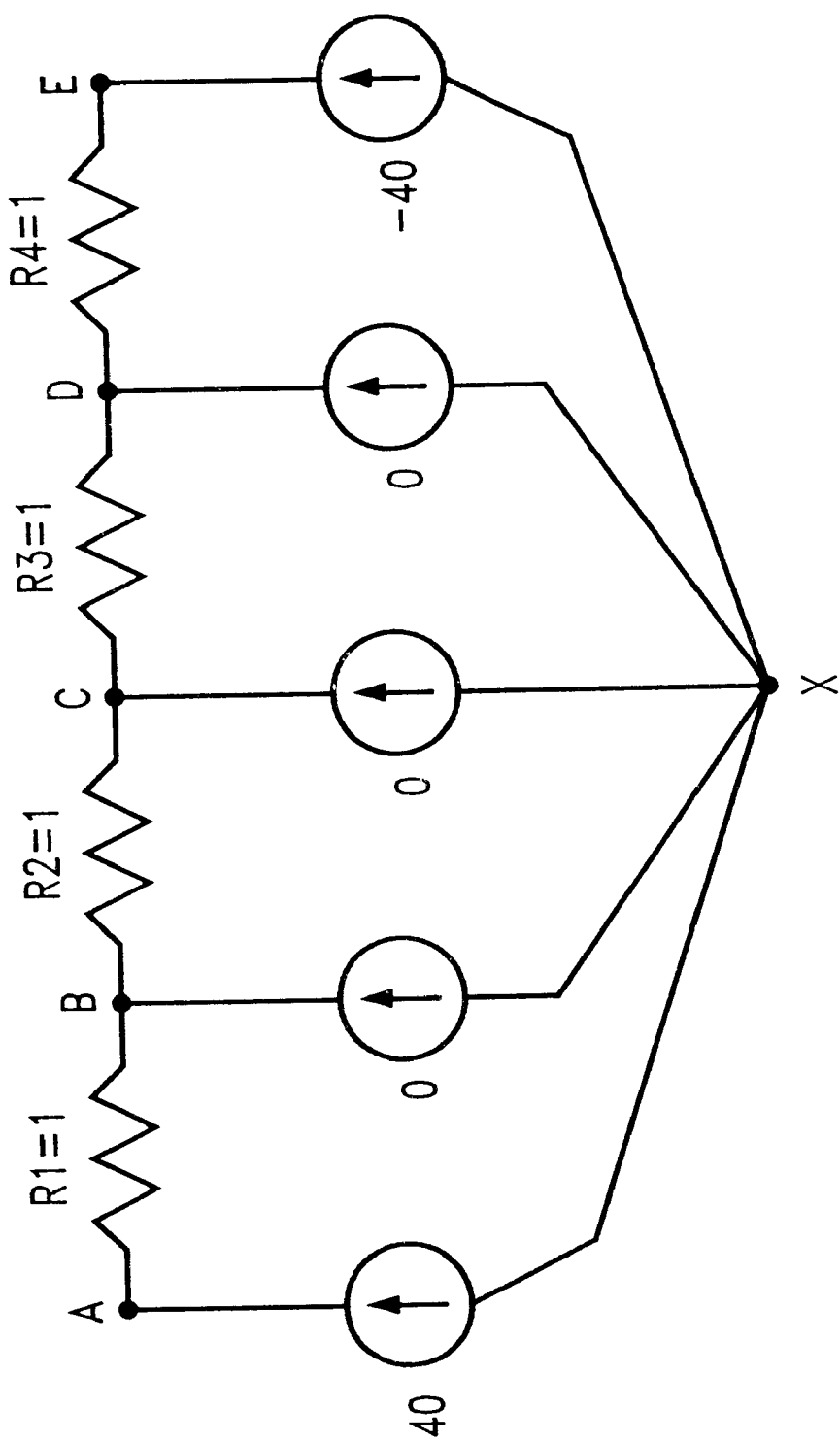
FIG. 2 is an electrical diagram of a network modeled, in accordance with the present invention, after the serially connected bins of FIG. 1.

In describing the preferred embodiment of the present invention, reference will be made herein to FIGS. 1–7 of the drawings in which like numerals refer to like features of the invention. Features of the invention are not necessarily shown to scale in the drawings.

The present invention provides a method for improving the distribution of a set of objects network, such as on an integrated circuit, including the aforestated examples of placement of a set of circuits on a chip, or balancing the load and/or fanout of a set of equivalent clock drivers in a clock tree. Alternatively, objects may be large data files, e.g., databases, and the containers may be network server computers. Other objects that may be distributed by the method of the present invention include distribution of inventory between warehouses. The example of distributing circuits on a chip may also use different size and capacity measurements, such as power consumption and the power dissipation capacity of each region, respectively, or the circuit current consumption and the power bus current providing capacity of each region, respectively.

The method of the invention may be considered by first constructing a graph of the entire network of containers and solving globally for the number (or total size) of objects which should flow between each pair of neighboring containers, and then redistributing objects between containers, with the objective not of balancing the occupancy of the two containers, but instead of moving the determined number (or cumulative size) of objects between the two containers.

Initially, objects are distributed among various interconnected containers. The initial number of objects in each of the containers is determined, and neighboring pairs of containers are identified. The number of objects is also referred to herein as the total size of the objects. Also, there is determined the cost of moving objects between each of the neighboring pairs of containers. The type of cost determined is dependent on the application. Where the objects are circuits to be placed on a chip, the cost may be the additional wire length; where the objects are clock sinks to be placed in clock nets, the cost may be an additional delay or increase in imbalance; or where the objects are data files to be located on network servers, the cost may be hardware and software to maintain data traffic. In general, the cost may include the additional money, material, time or other parameter to maintain performance, as well as any unrecovered decrease in quality, performance or yield, as a result of moving the object.

After the object-moving cost is determined, the desired occupancy of each container after redistribution is determined by dividing the total number of objects in all of the containers in the network by the total number of containers. Alternatively, a desired container occupancy after redistribution is designated such that the sum of the container occupancies equals the total size of all objects being distributed. Then, the number of objects initially in each of the containers is subtracted from the desired occupancy of each container after redistribution to determine the change in number in each container. Because the sum of the container occupancies is constrained to equal the total size of all objects being distributed, the sum of these changes in container occupancy will be zero. In the method of the present invention, it has been unexpectedly found that the object flow among the containers may be determined by a method analogous to solving for current flow within a network of resistors:

An electrical network model is initially created with a node for each container and a resistor between the nodes representing each pair of neighboring containers. The size of the resistor is determined by the distance between the containers, i.e., the cost of moving objects between the containers. The cost may be determined by any conventional method.

The desired occupancy of each container is then determined and the number or cumulative size of objects which must be added to or removed from the container, to achieve this occupancy, is determined. A theoretical electrical network model is created by designating a node representing each container, and designating a resistor between pair of nodes representing neighboring pairs of containers between which objects may flow. Each resistor represents the cost of moving objects between the neighboring pairs of containers. Finally, a theoretical current source is connected to each node, with the current source representing the change in number of objects in each container after redistribution, as previously calculated. If the container needs to lose objects the theoretical current flow is directed into the node; if the container needs to gain objects the theoretical current flow is directed out of the node. Since these current sources represent redistribution of existing objects, the sum of these theoretical current flows over all nodes will always be zero.

The theoretical electrical network model is subsequently solved to determine the theoretical current flow in each resistor. This is done by creating equations of current flow for each node, reducing the current flow equations for each node to simultaneous linear equations, and solving the simultaneous linear equations for theoretical current flow in each resistor. This represents the number, or cumulative size, of objects which should flow between the containers represented by the nodes connected by the resistor.

FIG. 1 illustrates an example of objects initially distributed in an interconnected series of containers. Containers or bins A, B, C, D and E are serially connected as shown, with the occupancy of numbers of objects in each bin shown as OCC. The capacity of each bin, i.e., the desired number of objects in each container after redistribution, is shown as CAP, and determined by adding the total number of objects in all of the bins and dividing by the number of bins. In the bins shown, the total number of objects in all the bins is 250, and the capacity of each bin is 50. The change in number of objects in each bin, JSRC, is determined for each bin by subtracting the capacity CAP from the occupancy OCC. This change in number of objects will later be used in the electrical network model to determine incoming current to each node.

FIG. 2 is a theoretical resistive electrical network modeled after the serially connected bins of FIG. 1. Each container or bin is represented by a comparably identified node, and a resistor identified as R1, R2, R3, R4 is shown between neighboring pairs of nodes. The resistive value for each is shown as 1, representing the cost of moving an object between the neighboring nodes. Below each node is a current source, with the value of change in number of objects in each bin, JSRC, as determined in FIG. 1. Since the sum total of number of objects does not change, this means that the theoretical electrical network model requires that the sum of the currents into all the bins is zero, any one of the current sources may be removed and the node attached to it may be collapsed into the lower node X, i.e., the selected node and X could be made the same node.

Using conventional electrical voltage, current and resistance relationships, and knowing that the sum of the currents flowing into each node is zero, FIG. 3 shows a current equation, i.e., I=V/R, for each node, where VA, VB, VC, VD and VE represent the voltages at each of the nodes. In FIG. 4, the current equations of FIG. 3 are reduced to simultaneous linear equations, which are then solved using well known mathematical methods, and the solutions are shown in FIG. 5. JR1, JR2, JR3, JR4 and JR5 represent the theoretical currents across each of the resistors, representing object flow between inter-bin connections.

Figure 6:
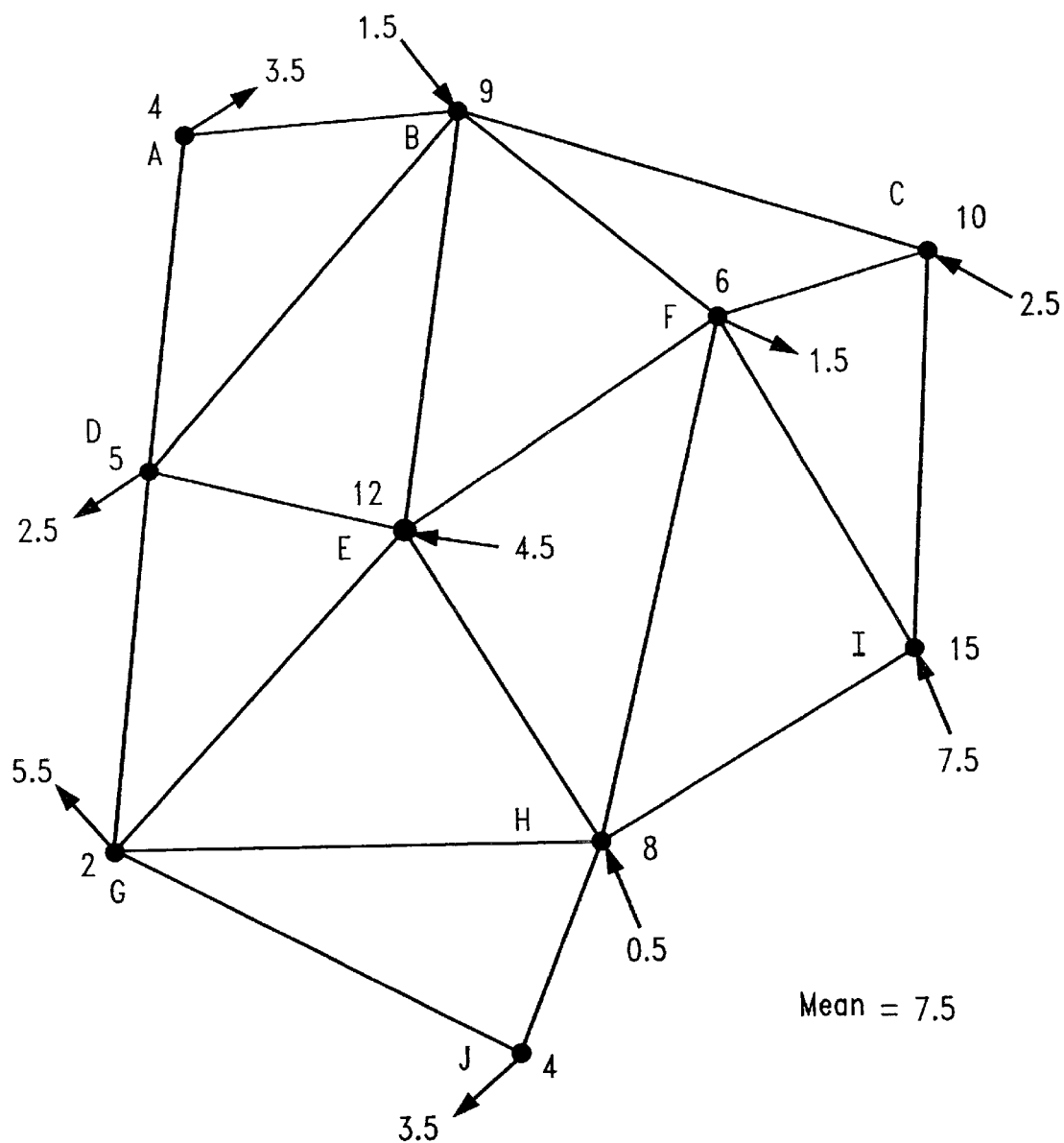
FIG. 6 shows a node diagram representing a number of containers and connections between neighboring pairs of the containers through which objects may be moved.

A larger number of containers A through J are shown in FIG. 6, along with the connections between neighboring pairs of the containers through which objects may be moved. The initial number of objects is shown by the number adjacent to each container. After determining the total number of objects (75) by adding the objects in each container, and dividing by the number of containers (10), the number of objects to be in each container after redistribution is the quotient, determined to be 7.5. The net flow of objects into or out of each container after redistribution is shown by the arrow and number adjacent each container. Net inflow to a container is represented by an arrow pointing away from the container, and net outflow from a container is represented by an arrow pointing toward the container. Since the sum of the flows into a node (including the added source flow) is zero, K units of flow must be pulled out of the node via the source connection in order to pull a balancing K units of flow in through the other network connections.

Figure 7:
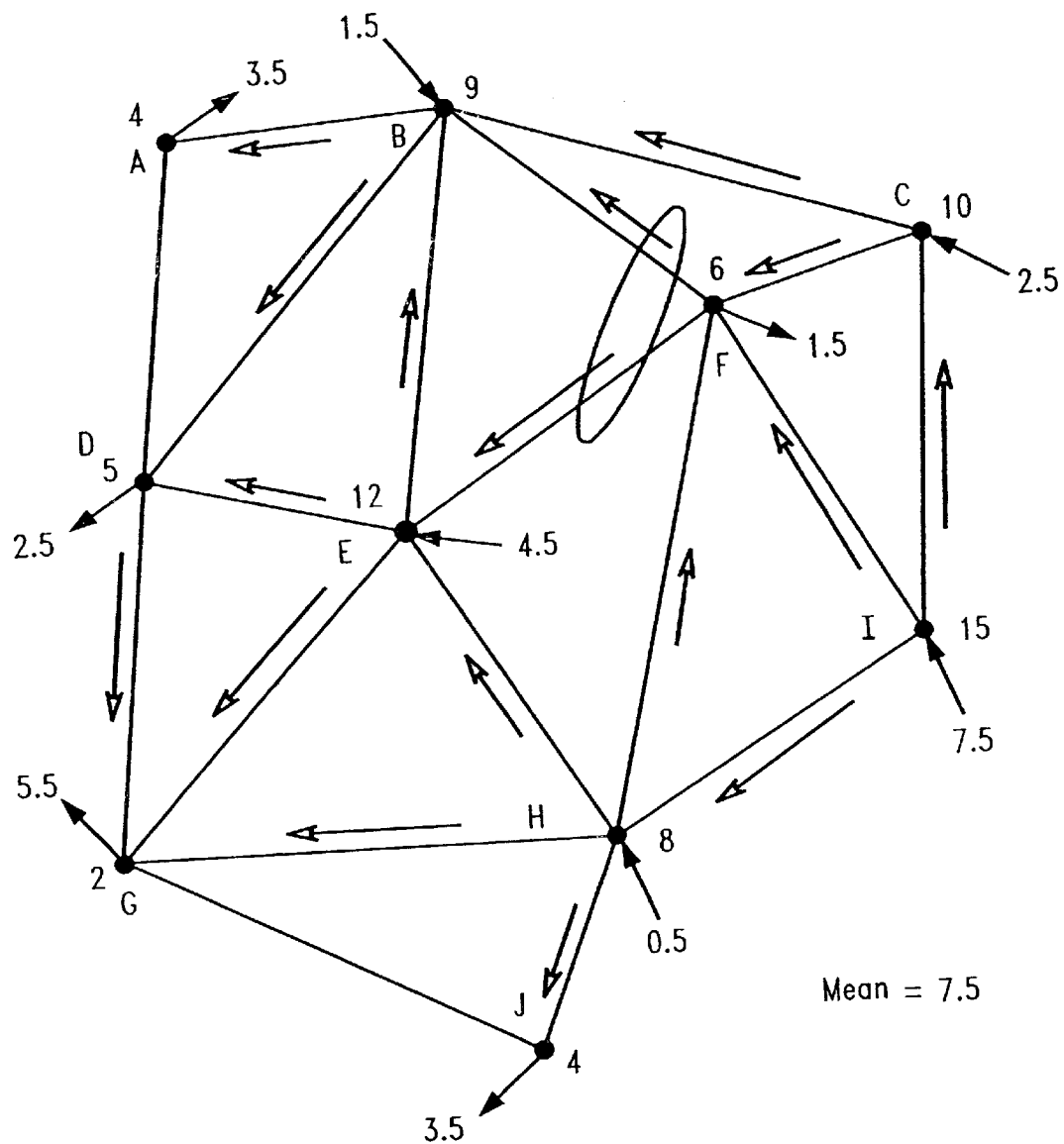
FIG. 7 shows a set of flows of objects for the node network of FIG. 6 obtained by the method of the present invention.

FIG. 7 shows a possible set of flows of objects obtained by the method of the present invention. The circled pair of object flows, between neighboring container pairs F and B, and F and E, are in directions opposite to that which would normally be produced by a local balancing algorithm looking only at these edges.

The redistribution of objects is then accomplished by performing pairwise redistribution of objects between neighboring pairs of containers.

Preferably, one would not choose a container pair between which a larger number of objects must flow than are currently present in the source container. Because of the properties of the network, there should always be at least one container pair which does not have this problem. For example, one might always choose to redistribute between the container with the largest residue after all outgoing flows are subtracted from its current occupancy, and the neighbor to which its largest flow goes. Such pairs are successively chosen until all neighboring pairs have been selected. Note that in this case no pair has to be revisited, since the entire desired flow is transferred the first time the pair is visited.

Similarly, it is preferable that the discretization of objects does not cause a cumulative imbalance in the number of objects in a container. For example, if a flow determined that a container should lose 4.51 objects to each of eight neighbors and each of these flows is rounded up to 5, the container will lose 40 objects while the desired loss would be only 36.08, which rounds most closely to 36 objects. This effect may be reduced as follows. Each time a pair of objects is visited, the discretization error in the flow is redistributed among the other neighbors of each container. In the example, this means that after 5 objects are moved to the container's first neighbor, the error (−0.49) is divided by the remaining seven neighbors and the answer or quotient is added to each, giving new flows of 4.44. For the next neighbor this flow is now rounded down to 4, and the error (−0.44) is divided by the remaining 6 neighbors and the quotient is again added to each to give adjusted flows of 4.5133. The end result will be that the net flow out of the container will be 36, as desired. The distribution of this discretization error itself causes some change in the net inflow or outflow of the neighbors of the containers whose flows are being adjusted. This effect can be propagated in a breadth-first fashion through the network until the total amount of error being propagated along any given connection is reduced to some threshold level. Alternatively, and at more expense, the entire current calculation may be repeated, replacing the resistor through which the flow was just forced with a theoretical current source whose magnitude is the actual number or cumulative size of objects which were moved. The distribution of this discretization error may also be done in different ways, e.g., it may be weighted by the original magnitude of the flow in the other connections to which it is being distributed, or by the resistance (distance) of those connections.

In the previous example, the initial distribution in the five containers was as follows, and parenthesized numbers between the containers represent the required flows:

| 90 | (→ 40) | 50 | (→ 40) | 50 | (→ 40) | 50 | (→ 40) | 10 |
|----|--------|----|--------|----|----|----|--------|----|

Applying the redistribution process of the present invention to this example gives the following sequence. The parenthesized numbers between the containers represent the computed flows, and the pair of neighbors with the largest occupancy difference are shown underlined:

EXAMPLE II

| | | | | | | | | |
|---|---|---|---|---|---|---|---|---|
| 1. | <u>50</u> | (→ 40) | 90 | (→ 40) | 50 | (→ 40) | 50 | (→ 40) | 10 |
| 2. | 50 | | <u>50</u> | (→ 40) | 90 | (→ 40) | 50 | (→ 40) | 10 |
| 3. | 50 | | 50 | | <u>50</u> | (→ 40) | 90 | (→ 40) | 10 |
| 4. | 50 | | 50 | | 50 | | <u>50</u> | (→ 40) | <u>50</u> |

In accordance with the present invention, the method converges in only five steps, and to an exactly balanced solution.

In some cases the size of an object may depend on the current distribution of objects to containers. For example, in the clock optimization application, the size of a sink could be the load attributable to that sink, which includes a fixed pin capacitance portion and a variable wire capacitance portion which depends in the current sink to net assignment. In the chip placement application, the size of a circuit might include a fixed portion which is the actual area occupied by the circuit and an expansion factor used to account for wiring congestion, which depends on the current assignment of circuits to regions. In such cases it may be desirable to reduce the net inflow or outflow from each container in order to avoid overshooting due to imprecision in the object size estimate. After an initial redistribution, the size estimates would then be updated and the process repeated. Because successive iterations would cause smaller flows (if we reduce the flows sufficiently to prevent any overshoot), the amount of perturbation to the distribution should reduce with each iteration. Alternatively, or in addition, when the flow-based redistribution is complete, a conventional local redistribution aimed at improving the balance between neighbors may be used to fine-tune distribution. Since all long range imbalances have been dealt with by the flow-based redistribution, this balancing phase should converge much more quickly.

Thus, the present invention provides an improved method for distributing a set of objects on an integrated circuit, which converges more quickly and which achieves better balance than prior art methods. The method is particularly useful for placement of a set of circuits on a chip, balancing the load and/or fanout of a set of equivalent clock drivers in a clock tree, or distributing large data files on network server computers.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of determining redistribution of objects among three or more containers in a network comprising:
   determining an initial set of objects in each of the containers;
   identifying neighboring pairs of containers;
   determining a cost of moving objects between each of the neighboring pairs of containers;
   determining a desired change in occupancy of each container; and
   determining a desired total size of a set of objects to be moved between each identified neighboring pair of containers by solving a set of simultaneous linear equations, wherein the simultaneous linear equations represent theoretical current flows in a theoretical electric network model in which each container is represented by a node, the cost of moving objects between each of the neighboring pairs of nodes is represented by a resistor, and change in number of objects in each node is represented by a current source, such that the total size of objects to be moved between neighboring pairs of containers is represented by current flow in each resistor.

2. The method of claim 1 further including redistributing the objects among the neighboring pairs of containers in accordance with the solution of the set of simultaneous linear equations.

3. The method of claim 2 wherein the step of redistributing the objects among the neighboring pairs of containers comprises:
   i) identifying neighboring pairs of containers in which the total size of objects to be moved does not exceed the total size of objects in the source container of the pair;
   ii) moving objects between one of the identified pair of containers of step (i); and
   iii) repeating steps (i) and (ii) until all neighboring pairs of containers have been identified.

4. The method of claim 3 wherein determining redistribution of objects between each neighboring pair of containers includes rounding the total size of objects to be moved between neighboring pairs of containers determined by the solution of the set of simultaneous linear equations to the nearest whole number.

5. The method of claim 3 wherein after objects are moved between each container and a container in a neighboring pair, any error between the rounded whole number and the actual size of objects to be moved between neighboring pairs of containers determined by the solution of the set of simultaneous linear equations is divided by the number of remaining neighbors of each container, and the quotient is added to the total size of objects to be moved for each remaining neighbor.

6. The method of claim 4 wherein after objects are moved between each container and a container in a neighboring pair, a new set of simultaneous linear equations is created and solved to determine the total size of objects to be moved between remaining neighboring pairs of containers.

7. The method of claim 1 wherein the objects are clock sinks and the containers are clock nets on an integrated circuit chip.

8. The method of claim 1 wherein the objects are circuits to be placed in an integrated circuit and the containers are regions of an integrated circuit chip.

9. The method of claim 1 wherein the objects are data files and the containers are individual network server computers.

10. A method of determining redistribution of objects among three or more containers in a network comprising:

determining an initial set of objects in each of the containers;

identifying neighboring pairs of containers;

determining a cost of moving objects between each of the neighboring pairs of containers;

determining desired occupancy of each container after redistribution;

subtracting the size of objects in each of the containers from the desired occupancy of each container after redistribution to determine the change in total size in each container;

creating a theoretical electrical network model by:
  designating a plurality of nodes, each node representing a container;
  designating a resistor between pair of nodes representing neighboring pairs of containers, each resistor representing the cost of moving objects between the neighboring pairs of containers; and
  designating a current source connected to each node, the current source representing the change in total size of objects in each container;

solving the theoretical electrical network model to determine theoretical current flow in each resistor, the current flow in each resistor representing the total size of objects to be moved between neighboring pairs of containers; and determining redistribution of objects between each neighboring pair of containers in accordance with the theoretical current flow solved in the theoretical electrical network model.

11. The method of claim 10 further including redistributing the objects among the neighboring pairs of containers in accordance with the theoretical current flow solved in the theoretical electrical network model.

12. The method of claim 10 wherein the theoretical electrical network model is solved by creating equations of current flow for each node, reducing the current flow equations for each node to simultaneous linear equations, and solving the simultaneous linear equations for theoretical current flow in each resistor.

13. The method of claim 11 wherein the step of redistributing the objects among the neighboring pairs of containers comprises:

i) for each container, determining the total size of objects remaining in the container after all objects determined to be moved in accordance with the theoretical current flow solved in the theoretical electrical network model are moved to containers paired therewith;

ii) identifying the container in step (i) having the largest total size of objects remaining in the container after all objects determined to be moved are moved to containers paired therewith;

iii) moving the objects from the container identified in step (ii) to a neighboring container to which the largest size of objects are to be moved from the container in accordance with the theoretical current flow solved in the theoretical electrical network model; and iv) repeating steps (i) through (iii) until all neighboring pairs of containers have been identified.

14. The method of claim 11 wherein determining redistribution of objects between each neighboring pair of containers includes rounding the total size of objects to be moved between neighboring pairs of containers determined by the theoretical current flow to the nearest whole number.

15. The method of claim 14 wherein after objects are moved between each container and a container in a neighboring pair, any error between the rounded whole number and the actual size of objects to be moved between neighboring pairs of containers determined by the theoretical current flow is divided by the total size of remaining neighbors of each container, and the quotient is added to the total size of objects to be moved for each remaining neighbor.

16. The method of claim 14 wherein after objects are moved between each container and a container in a neighboring pair, a new theoretical electrical network model is created and solved to determine the total size of objects to be moved between remaining neighboring pairs of containers.

17. The method of claim 13 including, prior to step (i), the step of identifying neighboring pairs of containers in which the total size of objects to be moved does not exceed the total size of objects in the source container of the pair.

18. The method of claim 10 wherein the objects are clock sinks and the containers are clock nets on an integrated circuit chip.

19. The method of claim 10 wherein the objects are circuits to be placed in an integrated circuit and the containers are regions of an integrated circuit chip.

20. The method of claim 10 wherein the objects are data files and the containers are individual network server computers.

21. A method of determining redistribution of clock sinks among three or more clock nets in a network on an integrated circuit chip comprising:

determining an initial set of clock sinks in each of the clock nets;

identifying neighboring pairs of clock nets;

determining a cost of moving clock sinks between each of the neighboring pairs of clock nets;

determining a desired change in occupancy of each clock net; and determining a desired total size of a set of clock sinks to be moved between each identified neighboring pair of clock nets by solving a set of simultaneous linear equations.

22. The method of claim 21 further including redistributing the clock sinks among the neighboring pairs of clock nets in accordance with the solution of the set of simultaneous linear equations.

23. The method of claim 22 wherein the step of redistributing the clock sinks among the neighboring pairs of clock nets comprises:

i) identifying neighboring pairs of clock nets in which the total size of clock sinks to be moved does not exceed the total size of clock sinks in the source clock net of the pair;

ii) moving clock sinks between one of the identified pair of clock nets of step (i); and iii) repeating steps (i) and (ii) until all neighboring pairs of clock nets have been identified.

24. The method of claim 23 wherein determining redistribution of clock sinks between each neighboring pair of clock nets includes rounding the total size of clock sinks to be moved between neighboring pairs of clock nets determined by the solution of the set of simultaneous linear equations to the nearest whole number.

25. The method of claim 23 wherein after clock sinks are moved between each clock net and a clock net in a neighboring pair, any error between the rounded whole number and the actual size of clock sinks to be moved between neighboring pairs of clock nets determined by the solution of the set of simultaneous linear equations is divided by the number of remaining neighbors of each clock net, and the quotient is added to the total size of clock sinks to be moved for each remaining neighbor.

26. The method of claim 24 wherein after clock sinks are moved between each clock net and a clock net in a neighboring pair, a new set of simultaneous linear equations is created and solved to determine the total size of clock sinks to be moved between remaining neighboring pairs of clock nets.

27. A method of determining redistribution of circuits to be placed among three or more regions of an integrated circuit chip comprising:

determining an initial set of circuits in each of the regions;

identifying neighboring pairs of regions;

determining a cost of moving circuits between each of the neighboring pairs of regions;

determining a desired change in occupancy of each region; and determining a desired total size of a set of circuits to be moved between each identified neighboring pair of regions by solving a set of simultaneous linear equations.

28. The method of claim 27 further including redistributing the circuits among the neighboring pairs of regions in accordance with the solution of the set of simultaneous linear equations.

29. The method of claim 28 wherein the step of redistributing the circuits among the neighboring pairs of regions comprises:

i) identifying neighboring pairs of regions in which the total size of circuits to be moved does not exceed the total size of circuits in the source region of the pair;

ii) moving circuits between one of the identified pair of regions of step (i); and iii) repeating steps (i) and (ii) until all neighboring pairs of regions have been identified.

30. The method of claim 29 wherein determining redistribution of circuits between each neighboring pair of regions includes rounding the total size of circuits to be moved between neighboring pairs of regions determined by the solution of the set of simultaneous linear equations to the nearest whole number.

31. The method of claim 29 wherein after circuits are moved between each region and a region in a neighboring pair, any error between the rounded whole number and the actual size of circuits to be moved between neighboring pairs of regions determined by the solution of the set of simultaneous linear equations is divided by the number of remaining neighbors of each region, and the quotient is added to the total size of circuits to be moved for each remaining neighbor.

32. The method of claim 30 wherein after circuits are moved between each region and a region in a neighboring pair, a new set of simultaneous linear equations is created and solved to determine the total size of circuits to be moved between remaining neighboring pairs of regions.

* * * * *